United States Patent
Jain et al.

(10) Patent No.: US 11,925,006 B2
(45) Date of Patent: Mar. 5, 2024

(54) COOLING SYSTEM WITH CONTINUOUSLY VARIABLE CAPACITY

(71) Applicant: Vertiv Corporation, Columbus, OH (US)

(72) Inventors: Gaurav Jain, Columbus, OH (US); John R. Birchmeier, Ashley, OH (US); Jack A. Moreno, Delaware, OH (US)

(73) Assignee: Vertiv Corporation, Westerville, OH (US)

(*) Notice: Subject to any disclaimer, the term of this patent is extended or adjusted under 35 U.S.C. 154(b) by 248 days.

(21) Appl. No.: 17/226,042

(22) Filed: Apr. 8, 2021

(65) Prior Publication Data

US 2021/0321545 A1    Oct. 14, 2021

Related U.S. Application Data

(60) Provisional application No. 63/007,838, filed on Apr. 9, 2020.

(51) Int. Cl.
H05K 7/20   (2006.01)

(52) U.S. Cl.
CPC ..... *H05K 7/20836* (2013.01); *H05K 7/20745* (2013.01); *H05K 7/20827* (2013.01)

(58) Field of Classification Search
CPC ........... H05K 7/20836; H05K 7/20745; H05K 7/20827
USPC ........................................................ 454/184
See application file for complete search history.

(56) References Cited

U.S. PATENT DOCUMENTS

| | | | |
|---|---|---|---|
| 3,505,828 A | 4/1970 | Molen et al. | |
| 5,040,377 A | 8/1991 | Braun et al. | |
| 5,058,390 A | 10/1991 | Sindermann et al. | |
| 5,271,238 A | 12/1993 | Powell et al. | |
| 5,291,745 A | 3/1994 | Hanson | |
| 5,533,352 A | 7/1996 | Bahel et al. | |
| 5,628,201 A | 5/1997 | Bahel et al. | |
| 6,257,007 B1 | 7/2001 | Hartman | |
| 6,336,337 B1 | 1/2002 | Yang | |
| 6,530,236 B2 | 3/2003 | Crane et al. | |
| 6,722,143 B2 | 4/2004 | Moon et al. | |
| 7,770,406 B2 | 8/2010 | Yoshioka et al. | |
| 7,836,713 B2 | 11/2010 | Lifson et al. | |

(Continued)

FOREIGN PATENT DOCUMENTS

WO        8900269 A1    1/1989

OTHER PUBLICATIONS

Multi-pipe units with scroll compressors; trane.com. Jul. 29, 2017.

(Continued)

*Primary Examiner* — Avinash A Savani
*Assistant Examiner* — Dana K Tighe
(74) *Attorney, Agent, or Firm* — Mackey Law Firm PLLC

(57) ABSTRACT

A cooling system can include a two-stage compressor, a variable speed fan and a controller for continuously modulating cooling capacity of the system. The compressor can run in a loaded state and the fan can run at a first speed when a call for cooling calls for maximum system cooling capacity. The compressor can run in the loaded state and the fan speed can decrease to a second fan speed as the called for cooling capacity decreases. The compressor can run in an unloaded state and the fan speed can be increased. The compressor can run in the unloaded state and the fan speed can decrease to a third fan speed as the called for cooling capacity decreases.

20 Claims, 3 Drawing Sheets

(56) References Cited

U.S. PATENT DOCUMENTS

| | | |
|---|---|---|
| 7,918,655 B2 | 4/2011 | Hurst et al. |
| 8,011,199 B1 | 9/2011 | Chen et al. |
| 8,826,679 B2 | 9/2014 | May et al. |
| 8,948,918 B2 | 2/2015 | Chamorro et al. |
| 9,696,075 B2 | 7/2017 | Fujimoto et al. |
| 9,810,469 B2 | 11/2017 | Boehde |
| 10,228,152 B2 | 3/2019 | Goel |
| 10,247,449 B2 | 4/2019 | Zhao et al. |
| 10,408,517 B2 | 9/2019 | Trudeau et al. |
| 2015/0276306 A1 | 10/2015 | Gomes et al. |

OTHER PUBLICATIONS

Variable-Capacity Air Conditioner; resources.lennox.com. Accessed: Nov. 14, 2019.

Infinity® Innovation; carrier.com. May 12, 2019.

York® Affinity Premium Residential Systems; york.com. Arp. 5, 2017.

Data Center Precision Cooling: The Need for a Higher Level of Service Expertise; vertiv.com. Accessed: Nov. 14, 2019.

US 11,925,006 B2

COOLING SYSTEM WITH CONTINUOUSLY VARIABLE CAPACITY

CROSS REFERENCE TO RELATED APPLICATIONS

This application claims the benefit of U.S. Provisional Patent Application No. 63/007,838 filed Apr. 9, 2020, the entire contents of which are hereby incorporated by reference herein.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

Field of the Invention

The present disclosure relates generally to cooling systems and more specifically relates to achieving continuously variable cooling capacity with a two-stage compressor and a variable speed fan.

Description of the Related Art

Cooling systems for server rooms utilized in edge computing and other relatively small information technology (IT) spaces often include components that operate within earshot of humans. For example, Liebert® Mini-Mate™ cooling units available from Vertiv Corporation (Columbus, OH) may be installed above false ceilings in server rooms or other spaces that may be occupied by or located near people concentrating on work tasks or otherwise. In addition, such systems can be subjected to part-load conditions wherein a system's maximum cooling capacity may not be needed or desired. Whether for purposes of energy efficiency or otherwise, variable capacity systems are desirable in at least some instances and can call for utilization of a compressor having a variable capacity for accommodating part-load requirements. Two common solutions for such applications are digital and variable speed compressors. However, digital and variable speed compressors can have drawbacks such as noisy operation and/or relatively high costs of ownership.

A need exists in the art for improved devices, systems and methods for more simply, quietly and cost effectively modulating cooling capacity.

BRIEF SUMMARY OF THE INVENTION

In at least one embodiment, a method of modulating cooling capacity, such as the cooling capacity of a cooling system comprising a two-stage compressor, a variable speed fan and at least one controller, can include running the compressor in a loaded state and the fan at a maximum speed (Fmax) when a call for cooling calls for maximum system cooling capacity (CFCmax), and running the compressor in the loaded state and decreasing the fan speed from Fmax toward a lesser fan speed F1 as the called for cooling capacity decreases from CFCmax toward a lesser cooling capacity CFC1. F1 can be the fan speed at which the cooling system has the same cooling capacity with the compressor running in the loaded state as the cooling system has when the fan is running at Fmax and the compressor is running in an unloaded state. CFC1 can be the system cooling capacity (a) when the fan is running at a fan speed of Fmax and the compressor is running in the unloaded state, and (b) when the fan is running at a fan speed of F1 and the compressor is running in the loaded state. A method can include running the compressor in the unloaded state and increasing the fan speed from F1 to Fmax when the called for cooling capacity reaches CFC1.

In at least one embodiment, a method can include running the compressor in the unloaded state and decreasing the fan speed from Fmax toward a lesser fan speed Fmin as the called for cooling capacity decreases from CFC1 toward a lesser cooling capacity CFCmin. Fmin can be the minimum fan speed of the cooling system and CFCmin can be the minimum system cooling capacity. A method can include decreasing the system cooling capacity from CFCmax to CFC1 at a constant rate. A method can include decreasing the system cooling capacity from CFCmax to CFCmin at a constant rate. Fmax can be a maximum allowable fan speed that is less than or equal to a maximum attainable fan speed of the fan. Fmin can be a minimum allowable fan speed that is greater than or equal to a minimum attainable fan speed of the fan. F1 can be greater than or equal to a minimum fan speed of the cooling system, which can be or include a minimum allowable, minimum allowed or minimum operable fan speed of the cooling system.

In at least one embodiment, a cooling system can include one or more two-stage compressors, one or more variable speed fans and one or more controllers operable to control the compressor(s) and the fan(s) in accordance with one or more methods and/or method steps of the disclosure, separately or in combination, in whole or in part. In at least one embodiment, a cooling system can include one or more two-stage compressors in the form of two single-stage compressors.

DETAILED DESCRIPTION

Figure 1:
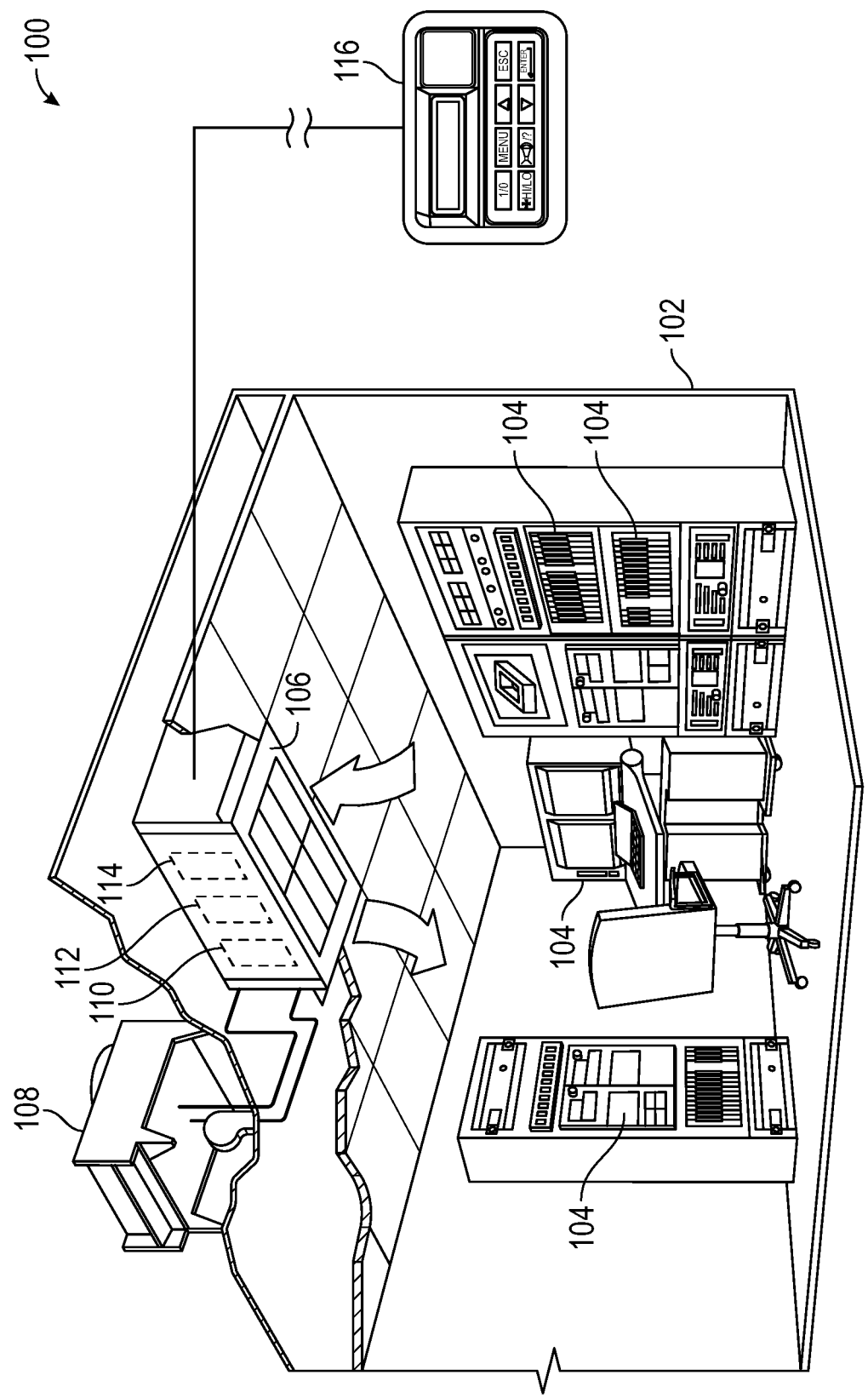
FIG. 1 is a schematic illustrating one of many embodiments of a cooling system according to the disclosure.

The Figures described above and the written description of specific structures and functions below are not presented to limit the scope of what Applicants have invented or the scope of the appended claims. Rather, the Figures and written description are provided to teach any person skilled in the art to make and use the invention(s) for which patent protection is sought. Those skilled in the art will appreciate that not all features of a commercial embodiment of the disclosure are described or shown for the sake of clarity and understanding. Persons of skill in this art will also appreciate that the development of an actual commercial embodiment incorporating aspects of the present disclosure can require numerous implementation-specific decisions to achieve the developer's ultimate goal for the commercial embodiment(s). Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts nevertheless would be a routine undertaking for those of skill in the art having the benefits of this disclosure.

The embodiment(s) disclosed and taught herein are susceptible to numerous and various modifications and alternative forms. The use of a singular term, such as, but not limited to, "a," is not intended as limiting of the number of items. The use of relational terms, such as, but not limited to, "top," "bottom," "left," "right," "upper," "lower," "down," "up," "side," "first," "second," ("third" et seq.), "inlet," "outlet" and the like are used in the written description for clarity in specific reference to the Figures and are not intended to limit the scope of the disclosure or the appended claims unless otherwise indicated. The terms "couple," "coupled," "coupling," "coupler," and like terms are used broadly herein and can include any method or device for securing, binding, bonding, fastening, attaching, joining, inserting therein, forming thereon or therein, communicating, or otherwise associating, for example, mechanically, magnetically, electrically, chemically, operably, directly or indirectly with intermediate elements, one or more pieces of members together and can further include without limitation integrally forming one member with another in a unity fashion. The coupling can occur in any direction, including rotationally. The terms "include" and "such as" are illustrative and not limitative, and the word "can" means "can, but need not" unless otherwise indicated. Notwithstanding any other language in the present disclosure, the embodiment(s) shown in the drawing(s) are examples presented for purposes of illustration and explanation and are not the only embodiments of the subject(s) hereof.

Applicants have created new and useful devices, systems and methods for more simply, quietly and cost effectively modulating cooling capacity utilizing a two-stage compressor and a variable speed fan. A cooling system can include a two-stage compressor, a variable speed fan and a controller for continuously modulating cooling capacity of the system. The compressor can run in a loaded state and the fan can run at a first speed when a call for cooling calls for maximum system cooling capacity. The compressor can run in the loaded state and the fan speed can decrease to a second fan speed as the called for cooling capacity decreases. The compressor can run in an unloaded state and the fan speed can be increased. The compressor can run in the unloaded state and the fan speed can decrease to a third and/or other reduced fan speed(s) as the called for cooling capacity decreases. The specific components, manufacturers, values, conditions and control aspects described herein and/or reflected in the Figures are disclosed for purposes of example and illustration and are not the only components, manufacturers, values, conditions and control aspects capable of being incorporated into or otherwise utilized in or for embodiments of the disclosure.

Figure 2:
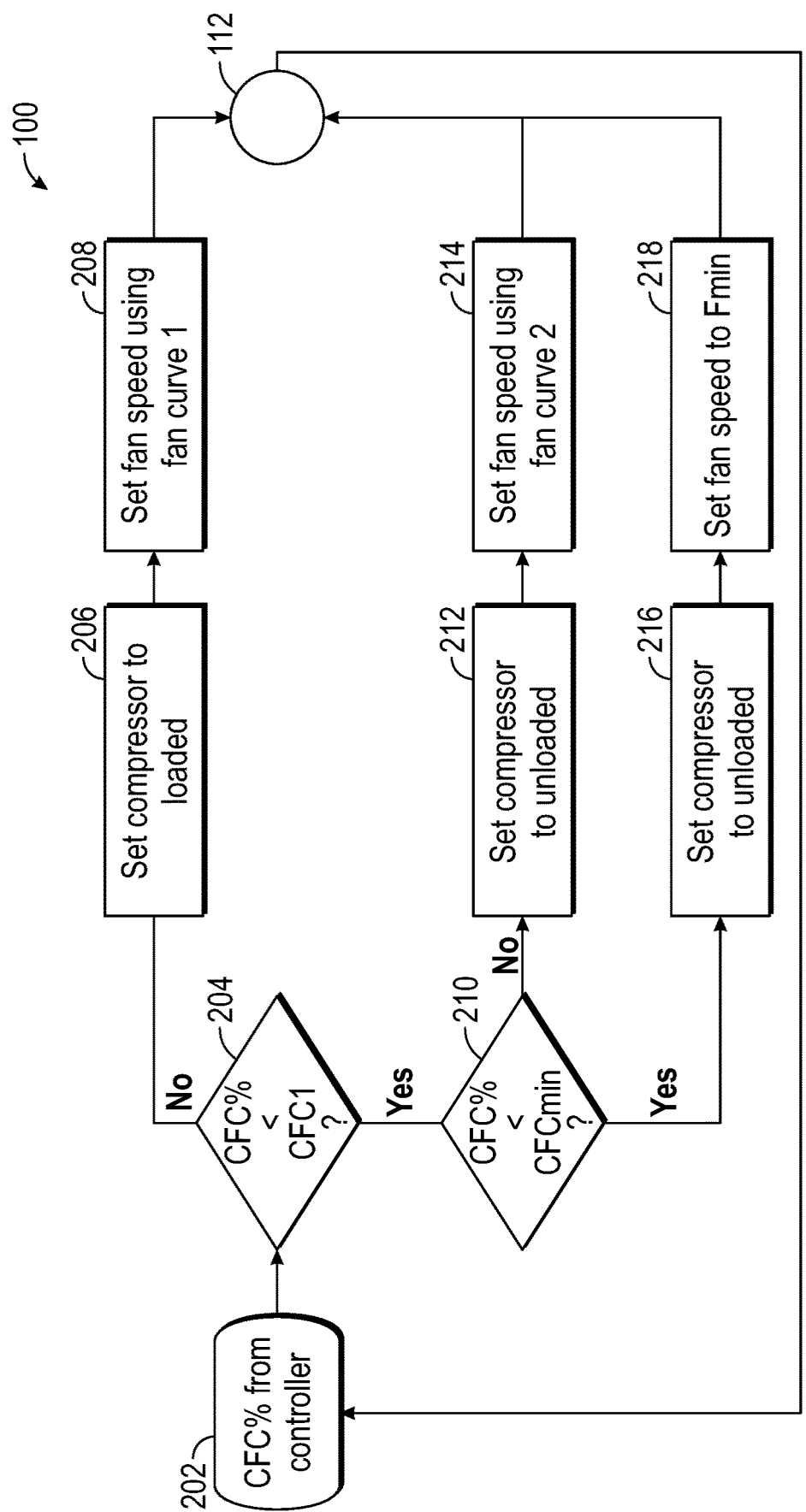
FIG. 2 is a flow chart illustrating one of many embodiments of a method of modulating cooling capacity according to the disclosure.
Figure 3:
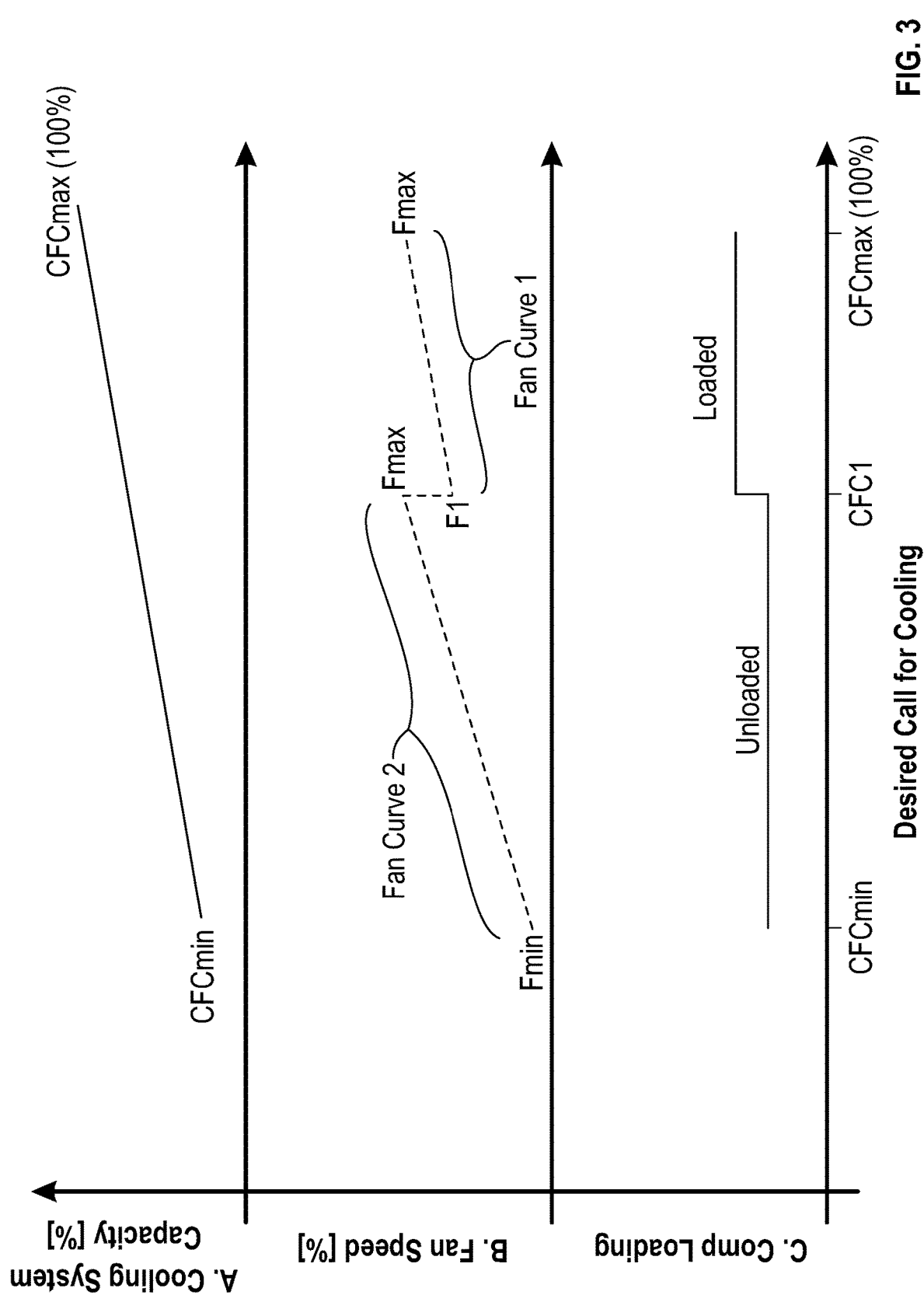
FIG. 3 is a graph illustrating one of many embodiments of a method of modulating cooling capacity according to the disclosure.

FIG. 1 is a schematic illustrating one of many embodiments of a cooling system according to the disclosure. FIG. 2 is a flow chart illustrating one of many embodiments of a method of modulating cooling capacity according to the disclosure. FIG. 3 is a graph illustrating one of many embodiments of a method of modulating cooling capacity according to the disclosure. FIGS. 1-3 will be described in conjunction with one another.

In at least one embodiment, a cooling system 100 according to the disclosure can be adapted for cooling a server room, office or other space 102 having one or more heat sources 104 disposed therein, such as computers, IT equipment or other electronics. System 100 can include an indoor unit 106, which can be or include an evaporator unit, for cooling air routed into space 102 via ducting and/or other air-routing equipment. As shown in FIG. 1 for illustrative purposes, in at least one embodiment, indoor unit 106 can be or include a ceiling-mounted unit, such as a Liebert® Mini-Mate™ cooling unit available from Vertiv Corporation (Columbus, OH); however, this need not be the case and system 100 can alternatively (or collectively) include one or more other indoor units 106 according to an implementation of the disclosure. System 100 can include an outdoor unit 108, which can be or include a condenser, condensing unit or other unit (e.g., a dry cooler), thermally coupled to indoor unit 106 for dissipating heat therefrom. System 100 can include or incorporate any type of cooling required or desired according to an implementation of the disclosure, including but not limited to air cooling, water/glycol cooling and chilled-water cooling, separately or in combination, in whole or in part. As will be appreciated by those skilled in the art having the benefits of the present disclosure, system 100 can include any of numerous known HVAC components for operably coupling indoor unit 106 and outdoor unit 108 to one another and/or to a space 102 to be cooled, including but not limited to ducting, plenums, wiring, piping, pumps, fluids, fluid sources, fluid containers, power-related components, insulating components, sensors and the like. Further, while the terms "indoor unit" and "outdoor unit" are used herein for purposes of illustration and ease of explanation, such terms are not intended to be limiting and, in at least one embodiment, indoor unit 106 can have or include one or more components located outdoors and outdoor unit 108 can have or include one or more components located indoors, which can be or include any component or components according to an implementation of the disclosure.

System 100 can include one or more compressors 110, such as a two-stage compressor, and one or more fans 112, such as a variable speed fan. In at least one embodiment, compressor 110 and fan 112 can be housed within or otherwise coupled to indoor unit 106. System 100 can include one or more controllers for controlling one or more aspects of system operation, which can include a controller 114 operably coupled to compressor 110 and fan 112 and a thermostat 116 disposed in wired or wireless communication with controller 114. Thermostat 116 can be configured for sending one or more signals to controller 114 for supporting cooling operations, which can include one or more calls for cooling (CFC) based on, for example, measured temperature within space 102. In at least one embodiment, which is but one of many, thermostat 116 can be or include a continuous thermostat with infinite (or effectively infinite) stages. Controller 114 can be configured to control the operation of compressor 110, for instance, by controlling when the compressor turns on, when the compressor operates at a first stage (e.g., full capacity or partial capacity), when the compressor operates at a second stage (e.g., full capacity or partial capacity), and/or when the compressor turns off. Controller 114 can be configured to control the operation of fan 112, for instance, by controlling when the fan turns on, when the fan turns off, and by controlling the fan's speed during operation. Controller 114 can be configured to control the speed of fan 112 from a minimum operating speed to a maximum operating speed, which can be or include any minimum and maximum operating speeds according to an implementation of the disclosure, whether such speeds are the same as or different from the minimum and maximum possible or attainable operating speeds of fan 112.

In at least one embodiment, cooling system 100 can be configured to continuously modulate the cooling capacity of the system for achieving continuously variable cooling capacity utilizing a two-stage compressor 110 and a variable speed fan 112 over a range of available cooling capacity for the system, which can be or include any range of cooling capacity according to an implementation of the disclosure. In other words, even though two-stage compressor 110 only has two stages of operation, such as an unloaded stage and a loaded stage, system 100 can nonetheless continuously adjust cooling output from a maximum system output to a minimum system output (or vice versa), which can advantageously enable system 100 to achieve precise temperature control for helping maximize the efficiency of system operation and without the need for more expensive and/or noisy components such as variable speed compressors or digital compressors.

In at least one embodiment, system 100 can run the compressor in a loaded state and the fan at a maximum speed (Fmax) when a call for cooling calls for maximum cooling capacity (CFCmax). Fmax can be a maximum allowable fan speed of the system, which can be or include any fan speed according to an implementation of the disclosure, including a fan speed less than or equal to a maximum attainable fan speed of the fan utilized by or incorporated into system 100. Similarly, CFCmax can be or include any maximum cooling capacity according to an implementation of the disclosure. System 100 can run the compressor in the loaded state and decrease the fan speed from Fmax toward a lesser fan speed F1 in partial load conditions, such as when the called for cooling capacity decreases from CFCmax toward a lesser cooling capacity CFC1. In at least one embodiment, F1 can be the fan speed at which the cooling system has the same cooling capacity with the compressor running in the loaded state as the cooling system has when the fan is running at Fmax and the compressor is running in an unloaded state. In at least one embodiment, CFC1 can be the system cooling capacity (a) when the fan is running at a fan speed of Fmax and the compressor is running in the unloaded state, and (b) when the fan is running at a fan speed of F1 and the compressor is running in the loaded state. CFC1 can be or include any cooling capacity less than CFCmax according to an implementation of the disclosure. In this manner, system 100 can be configured to continuously modulate or vary system cooling capacity or output to accommodate changing or changes in load conditions or cooling requirements between or among CFC1 and CFCmax (see, e.g., Fan Curve 1 in graph B of FIG. 3), which advantageously provides for precise temperature control throughout such a range to at least partially minimize or prevent undercooling and/or overcooling in partial load or other conditions.

Similarly, system 100 can be configured to continuously modulate or vary system cooling capacity or output to accommodate changing or changes in load conditions or cooling requirements less than CFC1, such as between or among CFC1 and a lesser cooling capacity CFCmin, which can but need not be a minimum attainable cooling capacity of the system (see, e.g., Fan Curve 2 in graph B of FIG. 3). System 100 can switch the compressor from the loaded state to the unloaded state and can run the compressor in the unloaded state and increase the fan speed from F1 to Fmax when the called for cooling capacity reaches CFC1 (see, e.g., graphs B and C of FIG. 3). System 100 can run the compressor in the unloaded state and can decrease the fan speed from Fmax toward a lesser fan speed Fmin as the called for cooling capacity decreases from CFC1 toward a lesser cooling capacity CFCmin. In at least one embodiment, Fmin can be the minimum fan speed of the cooling system, which can be or include any fan speed according to an implementation of the disclosure, whether a minimum attainable fan speed of the fan utilized or another fan speed less than fan speed F1. In at least one embodiment, CFCmin can be the minimum cooling capacity of the system, which can be or include any cooling capacity according to an implementation of the disclosure, whether a minimum attainable cooling capacity based on system design or component limitations (e.g., freezing or condensation considerations) or another cooling capacity less than CFC1. CFCmin is a function of the particular physical implementation at hand and can have any value greater than 0% of CFCmax but less than 100% of CFCmax, i.e., considering the goals, capabilities and limitations of such particular implementation of the disclosure. In other words, CFCmin is less than CFC1 and CFC1 is less than CFCmax.

In at least one embodiment, system 100 can decrease and/or increase system cooling capacity from CFCmax to CFC1 or vice versa at a constant rate (see, e.g., graph A of FIG. 3). In at least one embodiment, system 100 can decrease and/or increase system cooling capacity from CFCmax and/or CFC1 to CFCmin or vice versa at a constant rate. Fmin can be a minimum allowable fan speed that is greater than a minimum attainable fan speed of the fan. F1 can be greater than a minimum fan speed of the cooling system, which can be or include a minimum allowable, minimum allowed or minimum operable fan speed of the cooling system. In at least one embodiment, CFC1 can be greater than 60% of CFCmax. In at least one embodiment, CFCmin can be greater than 50% of CFCmax. In at least one embodiment, CFCmin and/or Fmin can be determined based on a minimum fan speed for preventing freeze up of a coil or heat exchanger in one or more of indoor unit 106 and outdoor unit 108 or for preventing condensation therein or thereon. For example, Fmin can be the minimum fan speed at which system 100 can operate without causing the evaporator coil(s) of indoor unit 106 to freeze or leading to water condensation within and/or outside the unit. As will be understood by a person of ordinary skill in the art having the benefits of the present disclosure, the particular value of Fmin can (but need not) vary from one implementation of the disclosure to another depending on the components utilized and other relevant details applicable for each such implementation.

System 100 can be configured to control operation of compressor 110 and fan 112 in any order required or desired for an implementation of the disclosure. Further, the order of operation can, but need not, depend on or differ according to whether a call for cooling is increasing or decreasing upon initiation or occurrence of a change in the operational state of compressor 110 and/or fan 112. For example, in at least one preferred embodiment, when an increasing call for cooling reaches CFC1 (see, e.g., FIG. 3) from a lesser call for cooling, compressor 110 can switch from an unloaded state to a loaded state and the speed of fan 112 can switch from Fmax to F1 at the same time (or at least substantially the same time). Similarly, in at least one preferred embodiment, when a decreasing call for cooling reaches CFC1 (see, e.g., FIG. 3) from a greater call for cooling, compressor 110 can switch from a loaded state to an unloaded state and the speed of fan 112 can switch from F1 to Fmax at the same time (or at least substantially the same time). As another example, the operation or change in operation of compressor 110 and/or fan 112 can exhibit hysteresis, e.g., at transition point CFC1. While such hysteresis is not reflected in the exemplary graphs of FIG. 3, a person of ordinary skill in the art having the benefits of the present disclosure will understand that hysteresis can be built into or otherwise present in system 100 for purposes of signal filtering, switch control and the like.

The aforementioned preferred embodiments and orders of operation are but some of many and other embodiments exist. For example, in at least one embodiment, when an increasing call for cooling reaches CFC1 (see, e.g., FIG. 3) from a lesser call for cooling, compressor 110 can switch from an unloaded state to a loaded state before or after the speed of fan 112 switches from Fmax to F1. As another example, when a decreasing call for cooling reaches CFC1 (see, e.g., FIG. 3) from a greater call for cooling, compressor 110 can switch from a loaded state to an unloaded state before or after the speed of fan 112 switches from F1 to Fmax.

With continuing reference to the Figures and particular reference to FIGS. 2-3, in at least one embodiment, system 100 (e.g., via controller 114) can be configured to receive 202 one or more calls for cooling, which can include, for example, one or more calls for cooling in the form of a percentage of system cooling capacity (CFC %), which can be or include any capacity according to an implementation of the disclosure. System 100 can be configured to determine 204 whether CFC % is less than CFC1. If no, system 100 can set 206 a compressor to run in a loaded state and can set 208 a fan to run at one or more fan speeds according to Fan Curve 1 (see, e.g., graph B of FIG. 3), the details of which curve can be determined as part of the system design according to an implementation of the disclosure. If yes, system 100 can determine 210 whether CFC % is less than CFCmin. If CFC % is not less than CFCmin, then system 100 can set 212 a compressor to run in an unloaded state and can set 214 a fan to run at one or more fan speeds according to Fan Curve 2 (see, e.g., graph B of FIG. 3), the details of which curve can be determined as part of the system design according to an implementation of the disclosure. If CFC % is less than CFCmin, then system 100 can set 216 a compressor to run in an unloaded state and can set 218 a fan to run at a minimum fan speed Fmin, which can be or include any minimum fan speed and the details of which can be determined as part of the system design according to an implementation of the disclosure.

In at least one embodiment, system 100 can include one or more controllers (e.g., controller 114, thermostat 116) for monitoring and/or controlling one or more aspects of the system, including but not limited to one or more of the aspects discussed above. For instance, as illustrated in the exemplary embodiment of FIG. 1, which is but one of many, system 100 can include a control and/or monitoring system comprising one or more control and/or monitoring system components for controlling and/or monitoring one or more aspects, variables or other characteristics of system 100 or a component thereof, which can be or include any component(s) or characteristic(s) according to an implementation of the disclosure. Such characteristics can include, but are not limited to, variables such as pressure, temperature, flow rate, density, voltage, current, power and frequency, separately or in combination, in whole or in part.

From the foregoing it will be appreciated that the devices, systems and methods of the present disclosure advantageously provide for more simply, quietly and cost effectively modulating cooling capacity utilizing a two-stage compressor and a variable speed fan versus solutions which use digital or variable speed compressors. In at least some implementations, the devices, systems and methods of the present disclosure advantageously provide for continuously variable cooling capacity down to 60% of the maximum system cooling capacity utilizing a two-stage compressor. While the use of a digital or variable speed compressor in such an implementation potentially could achieve continuously variable cooling capacity down to a lesser percentage (e.g., 40%) of the maximum system cooling capacity, the devices, systems and methods of the present disclosure nonetheless are advantageous in at least implementations wherein use of a two-stage compressor is more desirable and, for instance, wherein a relatively lower minimum cooling capacity that could be achieved through use of a digital or variable speed compressor (i.e., instead of a two-stage compressor) is not needed or does not justify the added costs or other downsides often associated with utilization of digital or variable speed compressors.

Furthermore, embodiments of the present disclosure are not necessarily limited to implementations wherein CFCmin is greater than or equal to 60% of CFCmax. For example, during testing of one embodiment of the present disclosure, which embodiment is but one of many, a CFCmin of 59% of CFCmax was determined using water as the working fluid and a CFCmin of 56% of CFCmax was determined using propylene glycol as the working fluid. The aforementioned values were limited by the freeze and condensation tests for the particular cooling unit utilized during testing and such values can be higher or lower for other embodiments of the disclosure.

As will be appreciated by those skilled in the art having the benefits of the present disclosure, aspects of one or more embodiments of the disclosure can be embodied as a system, method or computer program product. Accordingly, aspects of the present embodiments can take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more non-transitory computer readable medium(s) having computer readable program code embodied thereon. Any combination of one or more computer readable media may be utilized. The computer readable media may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples of such computer readable storage media include but are not limited to the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium or media, including but not limited to wireless, wireline, optical fiber cable, RF, etc., or any suitable combination of the foregoing. Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on a user's computer, partly on a user's computer, as a stand-alone software package, partly on a user's computer and partly on a remote computer or entirely on a remote computer or server. In the latter scenario, the remote computer may be connected to a user's computer through any type of network, including a local area network (LAN) or a wide area network (WAN), or the connection may be made to an external computer (for example, through the Internet using an Internet Service Provider or via a short-range wireless interconnection such as Bluetooth).

Aspects of the present disclosure can be described with reference to flowchart illustrations and/or block diagrams of methods, apparatuses (devices and systems) and computer program products according to embodiments of the disclosure. Each block of a flowchart illustration and/or block diagram, and combinations of blocks in a flowchart illustration and/or block diagrams, can be implemented by computer program instructions. These computer program instructions may be provided to a processor of a general purpose computer, special purpose computer, or other programmable data processing apparatus to produce a machine, such that the instructions, which executed via one or more processors, create means for implementing the functions/acts specified in the flowchart and/or block diagram block or blocks. The computer program instructions can be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in a flowchart and/or block diagram block or blocks. Each block in a flowchart and/or block diagram can be split into multiple blocks and/or combined with other blocks to make a single block.

In at least one embodiment, a method of modulating cooling capacity, such as the cooling capacity of a cooling system comprising a two-stage compressor, a variable speed fan and at least one controller, can include running the compressor in a loaded state and the fan at a maximum speed (Fmax) when a call for cooling calls for 100% system cooling capacity (CFCmax), and running the compressor in the loaded state and decreasing the fan speed from Fmax toward a lesser fan speed F1 as the called for cooling capacity decreases from CFCmax toward a lesser cooling capacity CFC1. F1 can be the fan speed at which the cooling system has the same cooling capacity with the compressor running in the loaded state as the cooling system has when the fan is running at Fmax and the compressor is running in an unloaded state. CFC1 can be the system cooling capacity (a) when the fan is running at a fan speed of Fmax and the compressor is running in the unloaded state, and (b) when the fan is running at a fan speed of F1 and the compressor is running in the loaded state. A method can include running the compressor in the unloaded state and increasing the fan speed from F1 to Fmax when the called for cooling capacity reaches CFC1.

In at least one embodiment, a method can include running the compressor in the unloaded state and decreasing the fan speed from Fmax toward a lesser fan speed Fmin as the called for cooling capacity decreases from CFC1 toward a lesser cooling capacity CFCmin. Fmin can be the minimum fan speed of the cooling system and CFCmin can be the minimum system cooling capacity. A method can include decreasing the system cooling capacity from CFCmax to CFC1 at a constant rate. A method can include decreasing the system cooling capacity from CFCmax to CFCmin at a constant rate. Fmax can be a maximum allowable fan speed that is less than a maximum attainable fan speed of the fan. Fmin can be a minimum allowable fan speed that is greater than a minimum attainable fan speed of the fan. F1 can be greater than a minimum fan speed of the cooling system, which can be or include a minimum allowable, minimum allowed or minimum operable fan speed of the cooling system. In at least one embodiment, CFC1 can be greater than 60% of CFCmax.

In at least one embodiment, CFCmin can be greater than 50% of CFCmax. In at least one embodiment, CFCmin can be less than or equal to 50% of CFCmax. In at least one embodiment, a cooling system can include one or more two-stage compressors, one or more variable speed fans and one or more controllers operable to control the compressor(s) and the fan(s) in accordance with one or more methods and/or method steps of the disclosure, separately or in combination, in whole or in part. In at least one embodiment, a cooling system can include one or more two-stage compressors in the form of two single-stage compressors. In at least one embodiment, a cooling system can include one or more controllers including or having access to non-transitory computer readable media having instructions stored thereon that, when executed by a processor, cause the processor to perform any method or method step disclosed herein, whether separately or in combination, in whole or in part, and in any order.

In at least one embodiment, a non-transitory computer-readable medium can be configured for modulating cooling capacity of a cooling system having a two-stage compressor and a variable speed fan. In such an embodiment, which is but one of many, the computer-readable medium can have instructions stored thereon that, when executed by a processor, cause a computer to perform the steps of running the compressor in a loaded state and the fan at a maximum speed (Fmax) when a call for cooling calls for 100% system cooling capacity (CFCmax), and running the compressor in the loaded state and decreasing the fan speed from Fmax toward a lesser fan speed F1 as the called for cooling capacity decreases from CFCmax toward a lesser cooling capacity CFC1. F1 can be the fan speed at which the cooling system has the same cooling capacity with the compressor running in the loaded state as the cooling system has when the fan is running at Fmax and the compressor is running in an unloaded state. CFC1 can be the system cooling capacity (a) when the fan is running at a fan speed of Fmax and the compressor is running in the unloaded state, and (b) when the fan is running at a fan speed of F1 and the compressor is running in the loaded state. The computer-readable medium can further include instructions stored thereon that, when executed by the processor, cause the computer to perform the steps of running the compressor in the unloaded state and increasing the fan speed from F1 to Fmax when the called for cooling capacity reaches CFC1.

In at least one embodiment, the computer-readable medium can further include instructions stored thereon that, when executed by the processor, cause the computer to perform the steps of running the compressor in the unloaded state and decreasing the fan speed from Fmax toward a lesser fan speed Fmin as the called for cooling capacity decreases from CFC1 toward a lesser cooling capacity CFCmin. Fmin can be the minimum fan speed of the cooling system and CFCmin can be the minimum system cooling capacity. In at least one embodiment, the computer-readable medium can further include instructions stored thereon that, when executed by the processor, cause the computer to perform the step of decreasing the system cooling capacity from CFCmax to CFC1 at a constant rate. In at least one embodiment, the computer-readable medium can further include instructions stored thereon that, when executed by the processor, cause the computer to perform the step of decreasing the system cooling capacity from CFCmax to CFCmin at a constant rate. In at least one embodiment, Fmax can be a maximum allowable fan speed that is less than a maximum attainable fan speed of the fan. In at least one embodiment, Fmin can be a minimum allowable fan speed that is greater than a minimum attainable fan speed of the fan. In at least one embodiment, F1 can be greater than a minimum fan speed of the cooling system, which can be or include a minimum allowable, minimum allowed or minimum operable fan speed of the cooling system. In at least one embodiment, CFC1 can be greater than 60% of CFCmax.

In at least one embodiment, CFCmin can be greater than 50% of CFCmax. In at least one embodiment, CFCmin can be less than or equal to 50% of CFCmax. In at least one embodiment, a cooling system can include one or more two-stage compressors, one or more variable speed fans and one or more controllers operable to control the compressor(s) and the fan(s) in accordance with one or more methods and/or method steps of the disclosure, separately or in combination, in whole or in part. In at least one embodiment, a cooling system can include one or more two-stage compressors in the form of two single-stage compressors. In at least one embodiment, a cooling system can include one or more controllers including or having access to non-transitory computer-readable media having instructions stored thereon that, when executed by a processor, cause the processor to perform any method or method step disclosed herein, whether separately or in combination, in whole or in part, and in any order.

In at least one embodiment, a variable capacity cooling device, system or apparatus can include a two-stage compressor, and/or two single-stage compressors, a variable speed fan and control circuitry electrically coupled to the compressor and the fan. In at least one embodiment, the control circuitry can be configured to run the compressor in a loaded state and the fan at a maximum speed (Fmax) when a call for cooling calls for 100% system cooling capacity (CFCmax), and run the compressor in the loaded state and decrease the fan speed from Fmax toward a lesser fan speed F1 as the called for cooling capacity decreases from CFCmax toward a lesser cooling capacity CFC1. F1 can be the fan speed at which the cooling system has the same cooling capacity with the compressor running in the loaded state as the cooling system has when the fan is running at Fmax and the compressor is running in an unloaded state. CFC1 can be the system cooling capacity (a) when the fan is running at a fan speed of Fmax and the compressor is running in the unloaded state, and (b) when the fan is running at a fan speed of F1 and the compressor is running in the loaded state. The control circuitry can be configured to run the compressor in the unloaded state and increase the fan speed from F1 to Fmax when the called for cooling capacity reaches CFC1.

In at least one embodiment, the control circuitry can be configured to run the compressor in the unloaded state and decrease the fan speed from Fmax toward a lesser fan speed Fmin as the called for cooling capacity decreases from CFC1 toward a lesser cooling capacity CFCmin. Fmin can be the minimum fan speed of the cooling system and CFCmin can be the minimum system cooling capacity. In at least one embodiment, the control circuitry can be configured to decrease the system cooling capacity from CFCmax to CFC1 at a constant rate. In at least one embodiment, the control circuitry can be configured to decrease the system cooling capacity from CFCmax to CFCmin at a constant rate. In at least one embodiment, Fmax can be a maximum allowable fan speed that is less than a maximum attainable fan speed of the fan. In at least one embodiment, Fmin can be a minimum allowable fan speed that is greater than a minimum attainable fan speed of the fan. In at least one embodiment, F1 can be greater than a minimum fan speed of the cooling system, which can be or include a minimum allowable, minimum allowed or minimum operable fan speed of the cooling system. In at least one embodiment, CFC1 can be greater than 60% of CFCmax.

Other and further embodiments utilizing one or more aspects of the devices, systems and methods disclosed herein can be devised without departing from the spirit of Applicants' disclosure. For example, the devices, systems and methods disclosed herein can be used alone or to form one or more parts of other cooling systems or cooling system components. Further, the various methods and embodiments can be included in combination with each other to produce variations of the disclosed methods and embodiments. Discussion of singular elements can include plural elements and vice-versa. References to at least one item followed by a reference to the item can include one or more items. Also, various aspects of the embodiments can be used in conjunction with each other to accomplish the understood goals of the disclosure.

Unless the context requires otherwise, the words "comprise," "include," and "has" (including variations and conjugations thereof, such as "comprises," "including," "have" and so forth) should be understood to imply the inclusion of at least the stated element or step or group of elements or steps or equivalents thereof, and not the exclusion of a greater numerical quantity or any other element or step or group of elements or steps or equivalents thereof. The devices, apparatuses and systems can be used in a number of directions and orientations. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components and/or can be combined into components having multiple functions. Unless the context indicates otherwise, the term "fluid(s)" as used herein includes any substance or material capable of flowing, such as, for example, liquid(s), gas(es) and combinations thereof (regardless of whether one or more solids or other non-fluids may be present therein).

The embodiments have been described in the context of preferred and other embodiments and not every embodiment of Applicants' disclosure has been described. Obvious modifications and alterations to the described embodiments are available to those of ordinary skill in the art having the benefits of the present disclosure. The disclosed and undisclosed embodiments are not intended to limit or restrict the scope or applicability of Applicants' disclosures, but rather, in conformity with the patent laws, Applicants intend to fully protect all such modifications and improvements that come within the scope or range of equivalents of the claims.

What is claimed is:

1. A non-transitory computer-readable medium for modulating cooling capacity of a cooling system having a two-stage compressor and a variable speed fan, the computer-readable medium having instructions stored thereon that, when executed by a processor, cause a computer to perform the steps of:
running the compressor in a loaded state and the fan at a maximum speed (Fmax) when a call for cooling calls for 100% system cooling capacity (CFCmax),
running the compressor in the loaded state and decreasing a fan speed from Fmax toward a lesser fan speed (F1) as the call for cooling decreases from CFCmax toward a lesser cooling capacity (CFC1),
wherein F1 is the fan speed at which the cooling system has equal cooling capacity with the compressor running in the loaded state as the cooling system has when the fan is running at Fmax and the compressor is running in an unloaded state, and
wherein CFC1 is the system cooling capacity (a) when the fan is running at Fmax and the compressor is running in the unloaded state, and (b) when the fan is running at F1 and the compressor is running in the loaded state; and
when the call for cooling reaches CFC1,
running the compressor in the unloaded state, and
increasing the fan speed from F1 to Fmax.

2. The computer-readable medium of claim 1, further comprising instructions stored thereon that, when executed by the processor, cause the computer to perform the steps of:
running the compressor in the unloaded state and decreasing the fan speed from Fmax toward a lesser fan speed (Fmin) as the call for cooling decreases from CFC1 toward a lesser cooling capacity (CFCmin),
wherein Fmin is a minimum fan speed of the cooling system, and
wherein CFCmin is a minimum system cooling capacity.

3. The computer-readable medium of claim 2, further comprising instructions stored thereon that, when executed by the processor, cause the computer to perform the step of decreasing the system cooling capacity from CFCmax to CFCmin at a constant rate.

4. The computer-readable medium of claim 2, wherein Fmin is a minimum allowable fan speed that is greater than a minimum attainable fan speed of the fan.

5. The computer-readable medium of claim 1, further comprising instructions stored thereon that, when executed by the processor, cause the computer to perform the step of decreasing the system cooling capacity from CFCmax to CFC1 at a constant rate.

6. The computer-readable medium of claim 1, wherein Fmax is a maximum allowable fan speed that is less than a maximum attainable fan speed of the fan.

7. The computer-readable medium of claim 1, wherein F1 is greater than a minimum allowable fan speed of the cooling system.

8. The computer-readable medium of claim 1, wherein CFC1 is greater than 50% of CFCmax.

9. The computer-readable medium of claim 1, further comprising instructions stored thereon that, when executed by the processor, cause the computer to perform the steps of:
running the compressor in the loaded state and varying the fan speed between F1 and Fmax as the call for cooling varies between CFC1 and CFCmax, such that when the call for cooling is between CFC1 and CFCmax the compressor is run in the loaded state and the fan operates at a first intermediate speed between F1 and Fmax, wherein the first intermediate speed continuously varies as the call for cooling continuously varies between CFC1 and CFCmax; and
running the compressor in the unloaded state and varying the fan speed between Fmax and a minimum speed (Fmin) as the call for cooling varies between CFC1 and a minimum cooling capacity (CFCmin), such that when the call for cooling is between CFCmin and CFC1 the compressor is run in the unloaded state and the fan operates at a second intermediate speed between Fmin and Fmax, wherein the second intermediate speed continuously varies as the call for cooling continuously varies between CFCmin and CFC1.

10. A variable capacity cooling system comprising:
a two-stage compressor;
a variable speed fan; and
control circuitry electrically coupled to the compressor and the fan, wherein the control circuitry is configured to
run the compressor in a loaded state and the fan at a maximum speed (Fmax) when a call for cooling calls for 100% system cooling capacity (CFCmax),
run the compressor in the loaded state and decrease a fan speed from Fmax toward a lesser fan speed (F1) as the call for cooling decreases from CFCmax toward a lesser cooling capacity (CFC1),
wherein F1 is the fan speed at which the cooling system has equal cooling capacity with the compressor running in the loaded state as the cooling system has when the fan is running at Fmax and the compressor is running in an unloaded state, and
wherein CFC1 is the system cooling capacity (a) when the fan is running at Fmax and the compressor is running in the unloaded state, and (b) when the fan is running at F1 and the compressor is running in the loaded state; and
when the call for cooling reaches CFC1,
running the compressor in the unloaded state, and
increasing the fan speed from F1 to Fmax.

11. The system of claim 10, wherein the control circuitry is further configured to
run the compressor in the unloaded state and decrease the fan speed from Fmax toward a lesser fan speed (Fmin) as the call for cooling decreases from CFC1 toward a lesser cooling capacity (CFCmin),
wherein Fmin is a minimum fan speed of the cooling system, and
wherein CFCmin is a minimum system cooling capacity.

12. The system of claim 11, wherein the control circuitry is further configured to decrease the system cooling capacity from CFCmax to CFCmin at a constant rate.

13. The system of claim 11, wherein Fmin is a minimum allowable fan speed that is greater than a minimum attainable fan speed of the fan.

14. The system of claim 10, wherein the control circuitry is further configured to decrease the system cooling capacity from CFCmax to CFC1 at a constant rate.

15. The system of claim 10, wherein Fmax is a maximum allowable fan speed that is less than a maximum attainable fan speed of the fan.

16. The system of claim 10, wherein F1 is greater than a minimum allowable fan speed of the cooling system.

17. The system of claim 10, wherein CFC1 is greater than 50% of CFCmax.

18. The system of claim 10, wherein the control circuitry is further configured to
- run the compressor in the loaded state and vary the fan speed between F1 and Fmax as the call for cooling varies between CFC1 and CFCmax, such that when the call for cooling is between CFC1 and CFCmax the compressor is run in the loaded state and the fan operates at a first intermediate speed between F1 and Fmax, wherein the first intermediate speed continuously varies as the call for cooling continuously varies between CFC1 and CFCmax; and
- run the compressor in the unloaded state and vary the fan speed between Fmax and a minimum speed (Fmin) as the call for cooling varies between CFC1 and a minimum cooling capacity (CFCmin), such that when the call for cooling is between CFCmin and CFC1 the compressor is run in the unloaded state and the fan operates at a second intermediate speed between Fmin and Fmax, wherein the second intermediate speed continuously varies as the call for cooling continuously varies between CFCmin and CFC1.

19. A method of modulating cooling capacity of a cooling system comprising a two-stage compressor, a variable speed fan and at least one controller, the method comprising:
- running the compressor in a loaded state and the fan at a maximum speed (Fmax) when a call for cooling calls for 100% system cooling capacity (CFCmax),
- running the compressor in the loaded state and decreasing a fan speed from Fmax toward a lesser fan speed (F1) as the call for cooling decreases from CFCmax toward a lesser cooling capacity (CFC1),
- wherein F1 is the fan speed at which the cooling system has equal cooling capacity with the compressor running in the loaded state as the cooling system has when the fan is running at Fmax and the compressor is running in an unloaded state, and
- wherein CFC1 is the system cooling capacity (a) when the fan is running at Fmax and the compressor is running in the unloaded state, and (b) when the fan is running at F1 and the compressor is running in the loaded state; and
- when the call for cooling reaches CFC1,
  - running the compressor in the unloaded state, and
  - increasing the fan speed from F1 to Fmax.

20. The method of claim 19, further comprising:
- running the compressor in the unloaded state and decreasing the fan speed from Fmax toward a lesser fan speed (Fmin) as the call for cooling decreases from CFC1 toward a lesser cooling capacity (CFCmin),
- wherein Fmin is a minimum fan speed of the cooling system, and
- wherein CFCmin is a minimum system cooling capacity.

* * * * *